Aug. 27, 1974 I. R. SADDLER ET AL 3,832,247
PROCESS FOR MANUFACTURING INTEGRATED CIRCUITS
Filed June 22, 1973
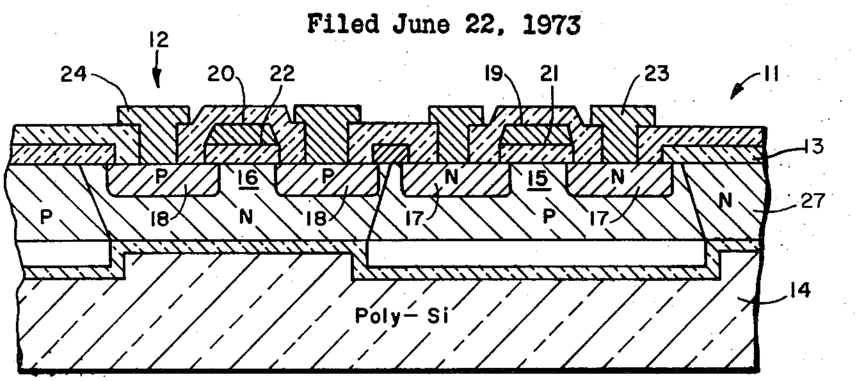
Fig. 1
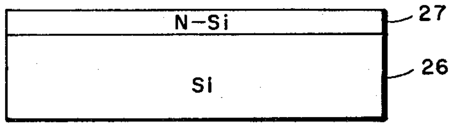
Fig. 2
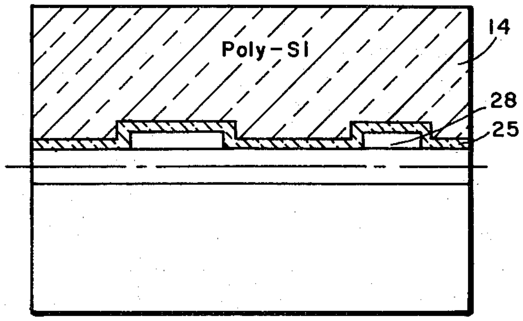
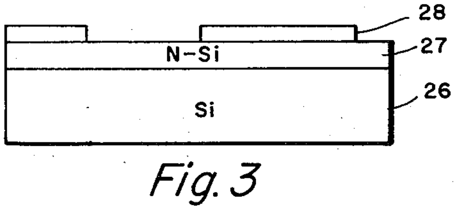
Fig. 3
Fig. 5
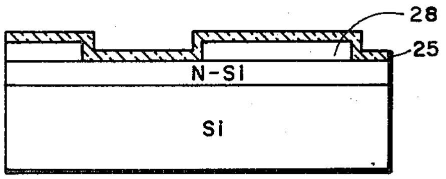
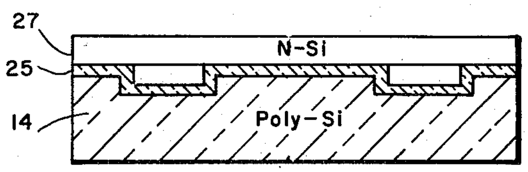
Fig. 4
Fig. 6
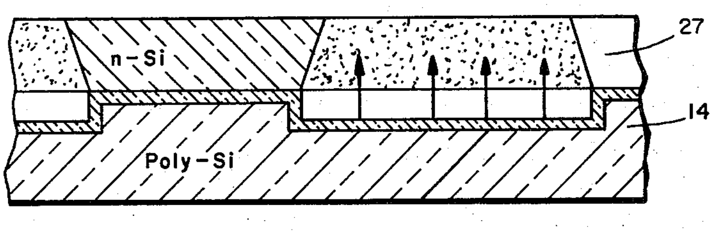
Fig. 7

3,832,247

PROCESS FOR MANUFACTURING INTEGRATED CIRCUITS

Ivan R. Saddler, Scottsdale, and John A. Fisher, Mesa, Ariz., assignors to Motorola Inc., Chicago, Ill.

Filed June 22, 1973, Ser. No. 372,892
Int. Cl. H01l 7/36, 27/02
U.S. Cl. 148—175 3 Claims

ABSTRACT OF THE DISCLOSURE

A process of manufacturing integrated circuits, particularly complementary integrated circuits, in an N-type semiconductor material which is formed upon an insulating substrate. The process includes steps of patterning a doping oxide such as aluminum oxide upon the semiconductor material; forming a dielectric layer over the semiconductor material and the doping layer; and then forming a polycrystalline silicon handle thereon. Following removal of most of the original semiconductor material, a heating step causes an up-diffusion from the doping layer into and through the semiconductor body to form P-type regions or tubs, therein.

BACKGROUND OF THE INVENTION

This invention relates to a process for the manufacture of integrated circuits and more particularly to a process for the manufacture of complementary transistor integrated circuits.

Semiconductor integrated circuits can be generally divided into three categories: hybrid, monolithic, and dielectrically isolated integrated circuits. In the hybrid form of circuits, semiconductor bars of what might be generally considered to be discrete devices are mounted on an insulating substrate. The insulating substrate generally has some form of thick or thin film circuit patterned thereon to form portions of the interconnection between the bars of semiconductor material.

In the monolithic type of integrated circuits, all of the semiconductor components are formed in a single monocrystalline semiconductor material. This type of structure requires some form of electrical isolation between the various semiconductor components to prevent parasitic interactions. Where component density is not a particular problem in the manufacture of a circuit of this type, spacing or distance alone may be sufficient to prevent parasitic interaction. However, to obtain high density of components, it is necessary to provide some form of isolation, normally by an isolation diffusion.

A dielectrically isolated integrated circuit is somewhat of a combination of the other two types in that it basically approximates a monolithic structure but utilizes a dissimilar insulating material in at least portions thereof to eliminate at least portions of the parasitic electrical characteristics to be avoided. One of these latter types is a so-called SOIS type of device, SOIS being an abbreviation for Silicon On Insulating Substrate. In its simplest form, a semiconductor wafer may merely have formed thereon a dielectric layer such as silicon dioxide, and then a handle material is deposited on the dielectric material, such handle material, for example, being polycrystalline silicon. More generally, however prior to formation of the dielectric layer, the wafer is moat etched so that when the dielectric is formed and the polycrystalline handle applied, the basic starting substrate material is removed to form the substrate material into a plurality of dielectrically isolated islands.

The design of various circuits is made less difficult when the use of opposite polarity transistors, i.e. both NPN and PNP type transistors are permitted. This is particularly true with reference to complementary metal oxide semiconductor (CMOS) integrated circuits wherein both N-channel and P-channel devices are utilized. In the manufacture of complementary integrated circuits, whether of the monolithic or dielectrically isolated types, regions or tubs of the opposite conductivity type must be provided in the basic semiconductor material so that opposite polarity transistors may be manufactured in the basic material and in the tubs by standard diffusion techniques to form both NPN and PNP transistors or for MOS both P-channel and N-channel FETs.

SUMMARY OF THE INVENTION

It is an object of this invention to provide an improved process for manufacturing integrated circuits, particularly complementary integrated circuits.

It is a further object of this invention to provide a process whereby regions of opposite conductivity type may be provided in the basic semiconductor material for the formation of complementary integrated circuits.

It is still a further object of this invention to provide such a process which is particularly applicable to silicon on insulating substrate integrated circuits.

In accordance with the foregoing objects, there is provided a process for manufacturing integrated circuits in a semiconductor material layer supported on an insulating substrate which process comprises the steps of forming a doping layer on portions of the surface of the semiconductor material; covering the doping material with the supporting insulating material and thereafter heating the substrate in a hydrogen atmosphere to diffuse the dopant material into the semiconductor layer to form opposite conductivity regions therein.

THE DRAWINGS

Further objects and advantages of the invention will be apparent from the following complete description thereof and from the drawings wherein:

FIG. 1 is a cross section of a complementary integrated circuit formed by the process in accordance with the invention; and FIGS. 2 to 7 are similar cross sections depicting successive stages in the manufacture of the integrated circuit of FIG. 1.

COMPLETE DESCRIPTION

A partial cross section of an MOS integrated circuit is shown in FIG. 1 and comprises an N-channel MOS device 11 and a P-channel MOS device 12 in an epitaxial layer 13 on a polycrystalline silicon substrate 14. The MOS transistor 11 is formed in a P-type tub or region 15 while the transistor 12 is formed in an N-conductivity type tube or region 16. N-type diffusion 17 forms source and drain electrodes for the transistor 11 while P-type diffusions 18 form source and drain regions for the transistor 12. Gate electrodes 19 and 20 overlie oxide layers 21 and 22 forming the further structure of the transistors 11 and 12 respectively. Contact members 23 and 24 make ohmic contact to the source and drain region. A dielectric layer 25 completely separates the overlying semiconductor regions from the polycrystalline silicon substrate 14.

The foregoing integrated circuit structure can be readily manufactured in accordance with the invention starting with a substrate 26 (FIG. 2) of silicon which may be lightly doped with either P- or N-type dopants. An N-type epitaxial layer 27 is grown on the starting monocrystalline silicon substrate 26. Then a layer of opposite dopant material, preferably aluminum oxide, is deposited on the epitaxial layer 27 and patterned to form islands where P-type tubs are to be produced in the resultant integrated circuit (FIG. 3). Following patterning of the aluminum oxide layer 28, a dielectric layer which forms the dielectric layer 25 of the resultant structure is deposited over the surface of the epitaxial layer 27 and the patterned islands of doping material 28, and the entire surface is covered with a polycrystalline substrate, or handle 14. The starting substrate 26 and a portion of the epitaxial layer 27 is then removed by polishing and lapping to the lap line 29 thereby resulting in a structure (shown in the inverted position) consisting of the polycrystalline handle 14, the dielectric layer 25, the islands of doping material 28, and the remaining epitaxial material 27 (FIG. 6). To form P-type tubs in the substrate, the wafer is then put in a diffusion furnace. The furnace is filled with hydrogen and heated at a temperature of approximately 1200° C. to effect up-diffusion of the aluminum from the aluminum oxide islands into those portions of the epitaxial layer 27 overlying said islands. The diffusion takes place in about one hour and results in a relatively lightly doped (approximately $1\text{–}2\times10^{16}$ atoms/cm.$^3$) P-type region. The integrated circuit of FIG. 1 then may be formed by suitable masking and diffusion steps utilizing any one of the standard metal gate or self-aligned silicon gate techniques.

As shown in FIG. 1, the integrated circuit may be formed by forming a dielectric layer 13 on the surface of the epitaxial layer 27. A polycrystalline silicon layer is then deposited and etched to form gate electrodes 19 and 20. Utilizing further masking of first one type of transistor and the other, P- and N-type diffusions are made to form the sources and drains while increasing the conductivity of the polycrystalline silicon gates. The circuits are then completely by a further layer of insulating material and suitable metal interconnects.

While the invention has been disclosed by way of the preferred embodiment thereof, it will be appreciated that suitable modifications may be made therein without departing from the spirit and scope of the invention.

What is claimed is:

1. A process for manufacturing integrated circuits including the steps of:
   providing a starting substrate of lightly doped silicon;
   forming an epitaxial layer of a first conductivity type thereon;
   patterning a doped oxide layer of the opposite conductivity type on said epitaxial layer;
   covering said epitaxial layer and said islands of doping material with a dielectric layer;
   depositing a polycrystalline silicon handle over the entire surface of the wafer and removing said starting substrate and a predetermined thickness of said epitaxial layer;
   placing the remaining substrate in a diffusion furnace;
   filling said diffusion furnace with hydrogen; and
   heating said substrate to a temperature of approximately 1200° C. for approximately one hour to effect up-diffusion of the doping material into the epitaxial layer so as to infuse the overlying layer with spaced, opposite conductivity type regions.

2. A process for manufacturing integrated circuits as recited in claim 1 wherein said epitaxial layer is N-type silicon and said doped oxide material is aluminum oxide and further including the steps of forming complementary semiconductor devices in the first type material and opposite type region.

3. A process for manufacturing integrated circuits as recited in claim 2 wherein said semiconductor devices are insulated gate field effect transistors formed by diffusing P-type source and drain regions in said N-type silicon and by diffusing N-type source and drain regions in said aluminum doped regions.

References Cited

UNITED STATES PATENTS

| | | | |
|---|---|---|---|
| 3,287,187 | 11/1966 | Rosenheinrich | 148—187 |
| 3,393,349 | 7/1968 | Huffman | 317—235 F X |
| 3,416,224 | 12/1968 | Armstrong et al. | 29—580 |
| 3,783,052 | 1/1974 | Fisher | 148—191 |

OTHER REFERENCES

Chiu et al.: "Metal Insulator Semiconductor FET Fabrication Process," IBM Tech. Discl. Bull., vol. 15, No. 2, July 1972, pp. 688–689.

L. DEWAYNE RUTLEDGE, Primary Examiner
W. G. SABA, Assistant Examiner

U.S. Cl. X.R.

29—571, 580; 117—201, 213; 148—188, 191; 357—42, 50